United States Patent
Winick et al.

(10) Patent No.: US 7,472,292 B2
(45) Date of Patent: Dec. 30, 2008

(54) SYSTEM AND METHOD FOR THROTTLING MEMORY POWER CONSUMPTION BASED ON STATUS OF COVER SWITCH OF A COMPUTER SYSTEM

(75) Inventors: Bradley Dean Winick, Ft. Collins, CO (US); Shaun Lee Harris, McKinney, TX (US); Russ W. Herrell, Ft. Collins, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 488 days.

(21) Appl. No.: 11/242,686

(22) Filed: Oct. 3, 2005

(65) Prior Publication Data

US 2007/0079152 A1 Apr. 5, 2007

(51) Int. Cl.
*G06F 1/00* (2006.01)
*G06F 1/32* (2006.01)
(52) U.S. Cl. .................. 713/300; 713/320; 713/323
(58) Field of Classification Search ................ 713/300, 713/340, 320, 323, 324
See application file for complete search history.

(56) References Cited

U.S. PATENT DOCUMENTS

| 5,861,684 | A | * | 1/1999 | Slade et al. ............ 307/66 |
| 6,199,127 | B1 | | 3/2001 | Ajanovic |
| 6,275,499 | B1 | * | 8/2001 | Wynn et al. ............ 370/438 |
| 6,356,470 | B1 | | 3/2002 | Sadler et al. |
| 6,430,068 | B1 | | 8/2002 | Sadler et al. |
| 6,564,288 | B2 | | 5/2003 | Olarig et al. |
| 6,564,328 | B1 | | 5/2003 | Grochowski et al. |
| 6,654,265 | B2 | | 11/2003 | Sadler et al. |
| 6,662,278 | B1 | | 12/2003 | Kahn et al. |
| 7,111,178 | B2 | * | 9/2006 | Rusu et al. ............ 713/300 |
| 2002/0066047 | A1 | | 5/2002 | Olarig et al. |
| 2002/0071568 | A1 | * | 6/2002 | Shuttleworth ........... 381/58 |
| 2003/0041289 | A1 | * | 2/2003 | Ku et al. ............... 714/39 |
| 2003/0065958 | A1 | * | 4/2003 | Hansen et al. .......... 713/300 |
| 2004/0054938 | A1 | * | 3/2004 | Belady et al. .......... 713/300 |
| 2004/0086284 | A1 | * | 5/2004 | Endo .................... 399/10 |
| 2004/0163001 | A1 | * | 8/2004 | Bodas ................... 713/300 |
| 2005/0044202 | A1 | * | 2/2005 | Shirota .................. 709/223 |

* cited by examiner

*Primary Examiner*—Suresh K Suryawanshi

(57) ABSTRACT

A power throttling method and system for a memory controller in a computer system. One embodiment includes, responsive to a determination that a change in the state of a cover switch has occurred that will result in an increase in an operating temperature of at least one memory device during normal operation, driving a throttle control signal to the memory controller to a level indicative of an over-threshold state.

12 Claims, 6 Drawing Sheets

SYSTEM AND METHOD FOR THROTTLING MEMORY POWER CONSUMPTION BASED ON STATUS OF COVER SWITCH OF A COMPUTER SYSTEM

CROSS-REFERENCE TO RELATED APPLICATIONS

This application is related to U.S. patent application Ser. No. 11/115,675, filed Apr. 27, 2005, entitled POWER THROTTLING SYSTEM AND METHOD FOR A MEMORY CONTROLLER and U.S. patent application Ser. No. 11/242,708, filed Oct 3, 2005, entitled SYSTEM AND METHOD FOR THROTTLING MEMORY ACCESSES, which are hereby incorporated by reference in their entireties.

BACKGROUND

One of the main reasons for the rapid change and growth in computer power requirements is the increase in volume of data processed, stored, transmitted, and displayed. As a result, power requirements have grown very rapidly over the last few years. To control the increase in power dissipation due to increased frequency and gate count, operating voltages have been reduced, since power scales as the square of voltage but scales linearly with respect to the frequency. The increasing frequency demand forces the voltages down proportionally in order to maintain a reasonable level of power dissipation. Today, feeding this large amount of ultraclean current at low voltages with huge transient response capability has become a key technology driver of power management in computer systems.

Such power supply concerns assume particular significance in advanced memory designs currently being implemented. Additionally, rising bus and processing speeds are also demanding newer memory architectures that deliver improved performance by increasing clock frequencies and available bandwidth. However, due to such ever-increasing performance requirements, issues of power consumption and dissipation have become even more critical in the field of computer system design.

It is well-known that a computer system memory can account for a significant portion of the computer system's total power consumption. Since the amount of power consumed by the memory can be quite variable and unpredictable depending on transactional throughput, current designs are typically overprovisioned in terms of power supply, cooling, line power, and the like, so as to maximize the potential power dissipation. Such overprovisioning is not only inefficient in terms of cost, but operates as a significant design constraint on the system memory density.

DETAILED DESCRIPTION OF THE DRAWINGS

Figure 1:
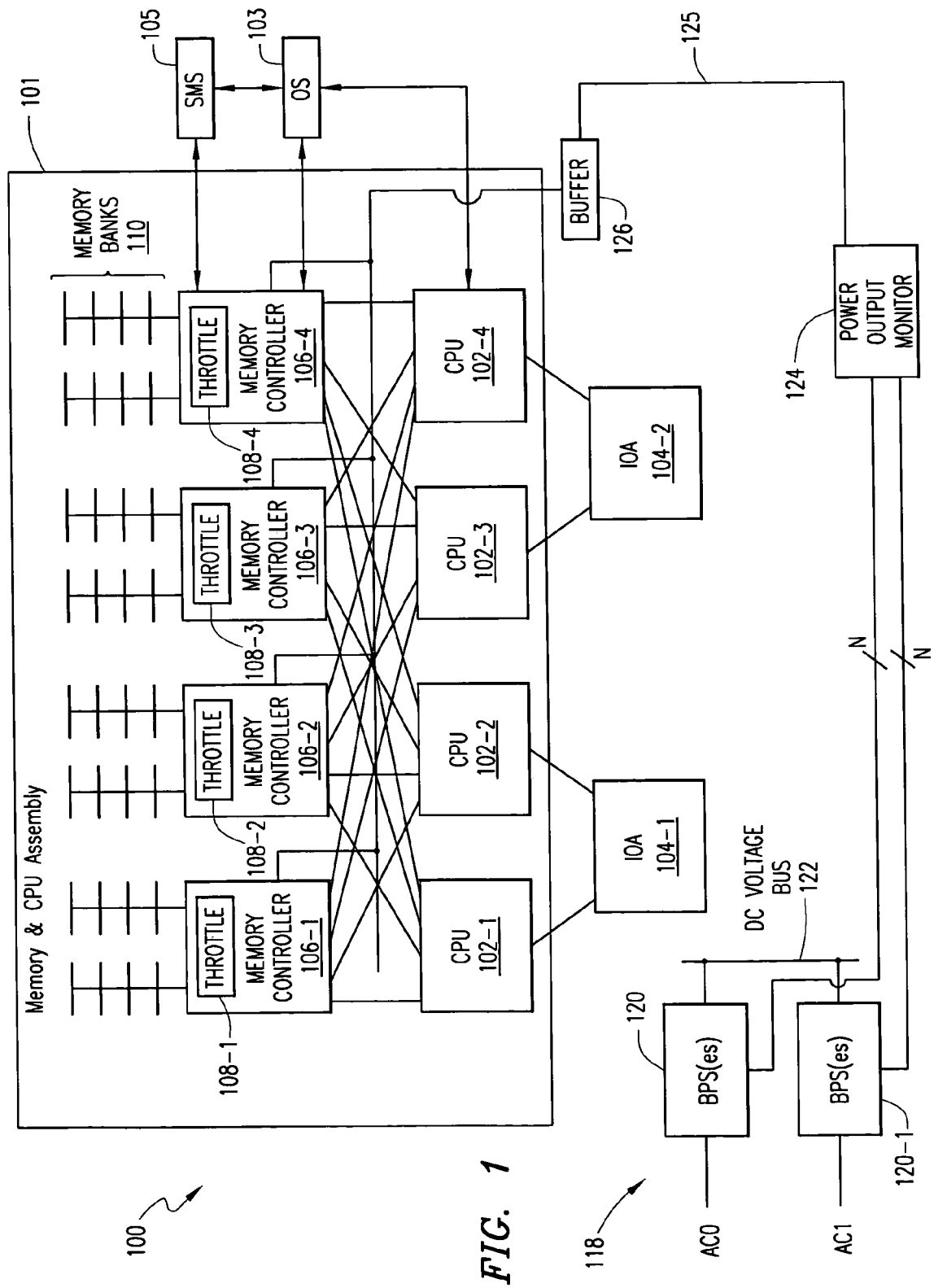
FIG. 1 depicts a block diagram of an embodiment of an exemplary computer system wherein a power throttling scheme may be practiced in accordance with the teachings of the present disclosure.

In the drawings, like or similar elements are designated with identical reference numerals throughout the several views thereof, and the various elements depicted are not necessarily drawn to scale. Referring now in particular to FIG. 1, depicted therein is a block diagram of an embodiment of an exemplary computer system 100 wherein a power throttling scheme for one or more memory controllers may be practiced in accordance with the teachings of the present disclosure. As illustrated in FIG. 1, a memory and CPU assembly 101 includes one or more processors, e.g., CPU 102-1 through CPU 102-4, which are coupled to one or more input/output adapters ("IOAs") 104-1, 104-2 for carrying out input and output operations. Each of the processors is also coupled to memory controllers 106-1 through 106-4 which issue well-known memory operation cycles (such as, e.g., read cycles, write cycles, burst transaction cycles, etc.) to a number of memory banks 110. It should be realized that the memory banks 110 may be comprised of memory devices selected from at least one of dynamic random access memory ("DRAM") devices, static random access memory ("SRAM") devices, read-only memory ("ROM") devices, and so on. For example, in one configuration, each of the memory banks 110 may be implemented as Dual In-line Memory Modules ("DIMMs") having a plurality of a Double Data Rate ("DDR") DRAM devices with a particular density, e.g., 256 Mb, 512 Mb, 1 Gb or 2 Gb, etc. Also, the memory devices can be of any known or heretofore unknown DDR type, e.g., DDR2(operable with 1.8V), DDR3(operable with 1.35V to 1.5V), and the like. Further, the DIMM configuration of an exemplary memory module may include unbuffered DIMMs, registered DIMMs ("RDIMMs"), or fully buffered DIMMs ("FBDs"), and may be configured as having one or more ranks (e.g., 2, 4, 8, or more).

One or more instances of an operating system ("OS") 103 are provided within the computer system 100 for controlling the operations therein. Those skilled in the art will recognize that OS 103 may comprise any UNIX-based operating system such as, for example, HP-UX®, AIX®, Linux®, Solaris®, etc., or other operating systems such as Microsoft® Windows®, Windows® Server, Windows® XP®/NT®, as well as Macintosh® MacOS® operating system. Additionally, one or more system management software ("SMS") applications 105 are provided as part of the software environment of the computer system 100.

In an embodiment illustrated in FIG. 1, a power module 118 comprises 2N AC/DC power supplies, referred to herein as bulk power supplies ("BPSs"), where N represents the minimum number of BFSs required to run the system 100, are provided. One half of the 2N BPSs, represented in FIG. 1 by a BPS 120-0, are connected to a first AC power source, designated "AC0", while the remaining one half of the BPSs, represented in FIG. 1 by a BPS 1201, are connected to a second AC power source, designated "AC1". The BPSs 120-0 and 120-1 provide DC voltage via a DC voltage bus 122. It will be recognized that, although the embodiment is described with reference to a 2N bulk power supply configuration, it is equally applicable to other configurations, including N, and N+1 configurations, as well as dual-grid configurations.

As will be described in greater detail below, additionally, each of the BPSs 120-0, 120-1, outputs its status (i.e., "good" or "faulted") to a power output monitor 124, which may be implemented as, for example, a microcontroller, a field programmable gate array ("FPGA"), or a digital signal processor ("DSP"). The power output monitor 124 determines whether the system bulk power supply capacity has dropped below the load demand. If not, the power output monitor 124 does nothing; otherwise, the power output monitor drives a throttle control signal 125, issued via a buffer 126 to the throttle control logic 108-1 through 108-4 of each memory controller 106-1 through 106-4, to an over-threshold state, which indicates to the throttle control logic of the memory controllers that a lower throttle value ("TV"), as described below, is to be selected, whereby a reduced rate of memory operation cycles are issued to the memory bank 110. Accordingly, the memory bank 110 uses less power when throttled with fewer cycles.

When the fault condition has been cleared and the bulk power supply capacity has returned to a sufficient level, the power output monitor 124 returns the throttle control signal 125 back to a normal state, which indicates to the throttle control logic of the memory controllers that a higher TV may be selected, whereby memory operation cycles are issued more frequently. Regardless of any particular memory architecture, density, technology, and configuration, the memory banks 110 are powered by one or more power modules, such as the power module 118. The power output of the power modules varies depending on the functional and operational utilization of the memory banks 110. As will be described in detail hereinbelow, appropriate throttle control logic 108-1 through 108-4 is provided in association with the memory controllers 106-1 through 106-4 for throttling the power consumption of the memory banks 110.

Figure 2:
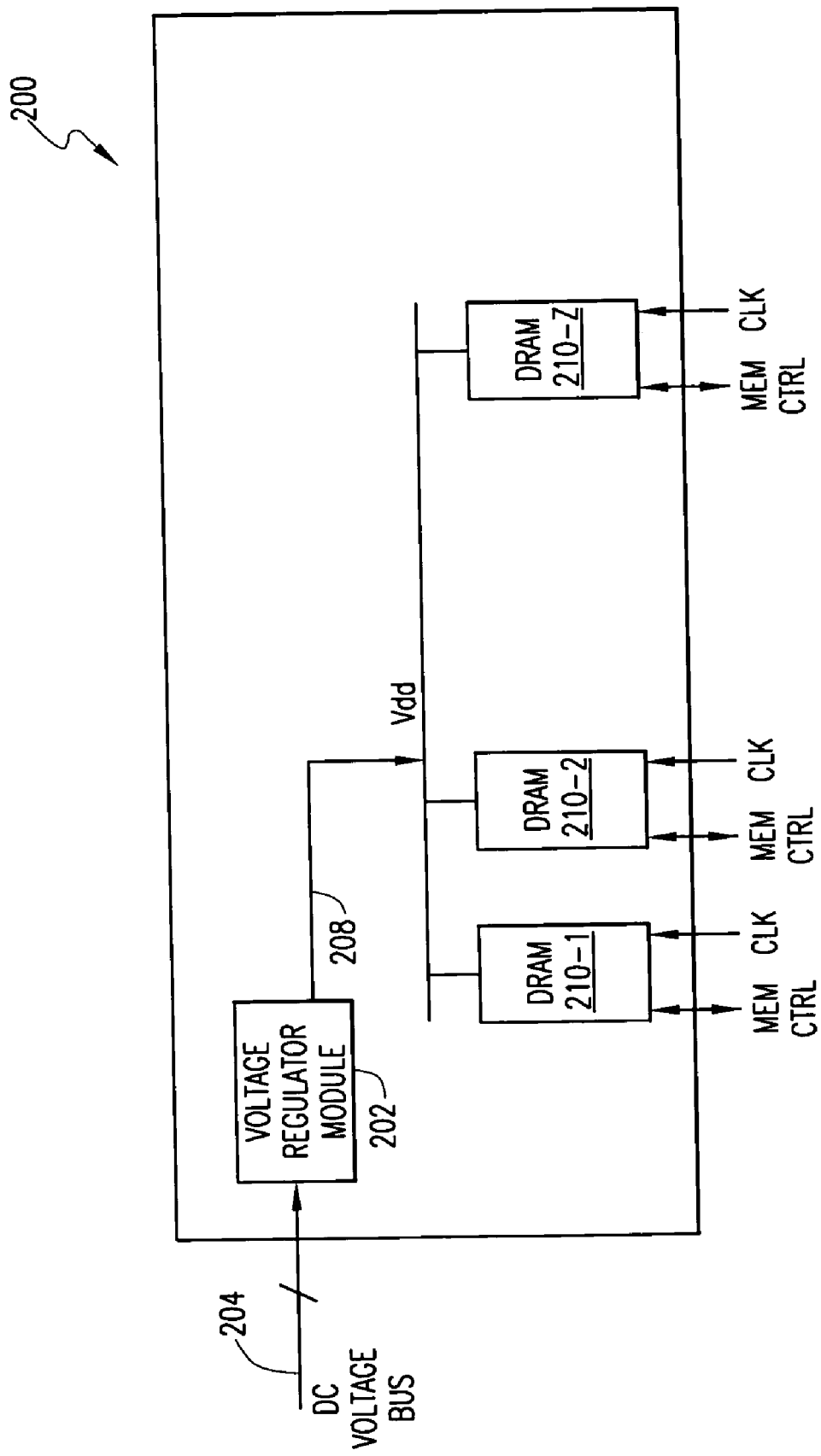
FIG. 2 depicts a block diagram of a power distribution system for a memory module according to one embodiment.

FIG. 2 depicts a block diagram of a power distribution system for a memory module 200 according to one embodiment. One or more memory devices 210-1 through 210-Z are provided as part of the memory module 200, each receiving a first voltage path 208, typically referred to as a $V_{dd}$ path, that may be energized to appropriate voltage levels depending on the type, functionality, and design of the memory devices, e.g., from about 0.5V to 3.5V or more.

In one embodiment, at least one on-board voltage regulator module ("VRM") 202 may be provided as part of the memory board assembly module 200 for converting an externally supplied voltage level available on external source path 204 from a power module into appropriate an local voltage level that powers the $V_{dd}$ voltage path 208. Preferably, a high-frequency switching voltage converter capable of generating tightly-controlled voltage levels may be implemented as the on-board VRM 202. For instance, multi-phase synchronous Pulse-Width Modulated ("PWM") controllers, Low Drop-Out ("LDO") controllers, et cetera, that are capable of accepting unregulated supply voltages over a broad range may be configured to operate as a local voltage supply for the memory module 200.

Those skilled in the art should recognize upon reference hereto that although providing a tightly-controlled VRM as local voltage supply for on-board power requirements may give rise to a number of advantages in the power supply design of an electronic component such as the memory module 200, some designs may not incorporate any on-board VRMs. It should be apparent, however, that irrespective of how the power supply is designed, the memory module 200 can exhibit highly variable power consumption levels depending on the memory operation activity.

Figure 3:
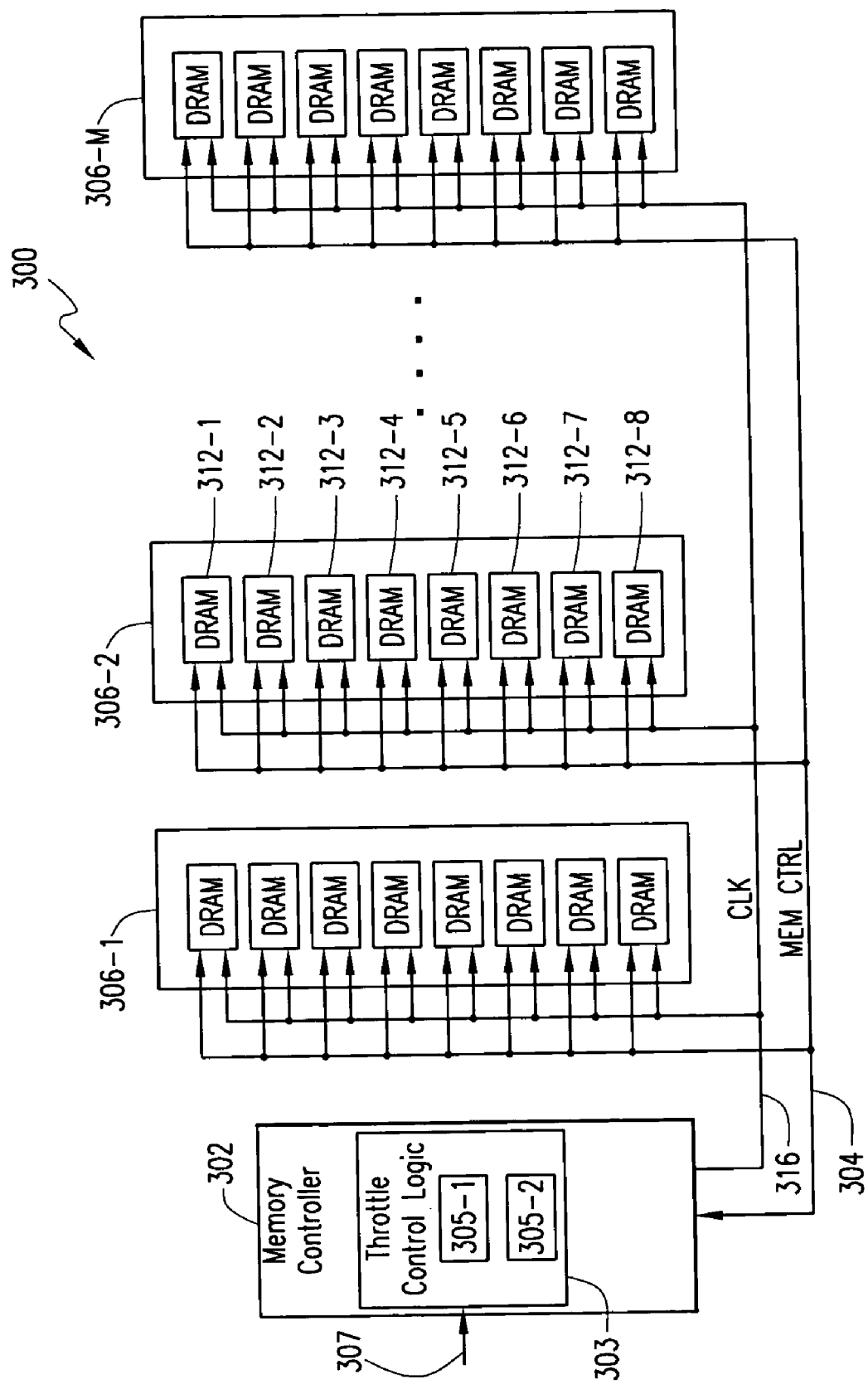
FIG. 3 depicts a block diagram of an exemplary memory controller and memory bank assembly according to one embodiment.

FIG. 3 depicts a block diagram of an exemplary memory controller and memory bank assembly 300 according to one embodiment. A memory controller 302, which is illustrative of the memory controllers 106-1 through 106-4 shown in FIG. 1, is operable to drive a bidirectional memory link 304 to which a plurality of memory boards 306-1 through 306-M are coupled. As exemplified by the memory board 306-2, each memory board includes eight DRAM devices 312-1 through 312-8. The memory controller 302 is operable to drive a plurality of clock signals to the memory boards 306-1 through 306-M via a clock bus 316. A system management bus ("SM bus") 310 is coupled to each of the memory boards 306-1 through 306-M. Although not explicitly shown in this FIGURE, each memory board also receives a power supply path for powering the DRAM components therein. In one arrangement, the supply voltage may be sourced from the memory controller 302 or from a separate voltage source.

A throttle control logic block 303 associated with the memory controller 302 includes a plurality of storage elements for storing a set of appropriate throttle values (TVs) thereat. By way of illustration, the storage elements may be comprised of registers 305-1, 305-2 for storing at least a first and second throttle values, respectively. The throttle control logic block 303 is operable responsive to a throttle control signal 307 for selecting a particular throttle value that determines whether memory operation cycles are issued by the memory controller 302 to the memory boards 306-1 through 306-M at a reduced rate or an increased rate.

One skilled in the art should appreciate that by providing more than two throttle values, a range of power throttling behavior can be implemented for a particular memory controller without affecting its clock source. In one implementation, a lower TV setting corresponds to issuing fewer memory operation cycles and a higher TV setting corresponds to issuing more frequent memory operation cycles. Where two TVs are provided, e.g., TV-1 and TV-2 associated with the memory controller 302, the throttle control signal 307 may be placed in one of two states that can select between the two TV settings. On the other hand, more complex selection logic may be implemented for selecting among a range of TV settings based on one or more throttle control signals and associated logic states.

Figure 4:
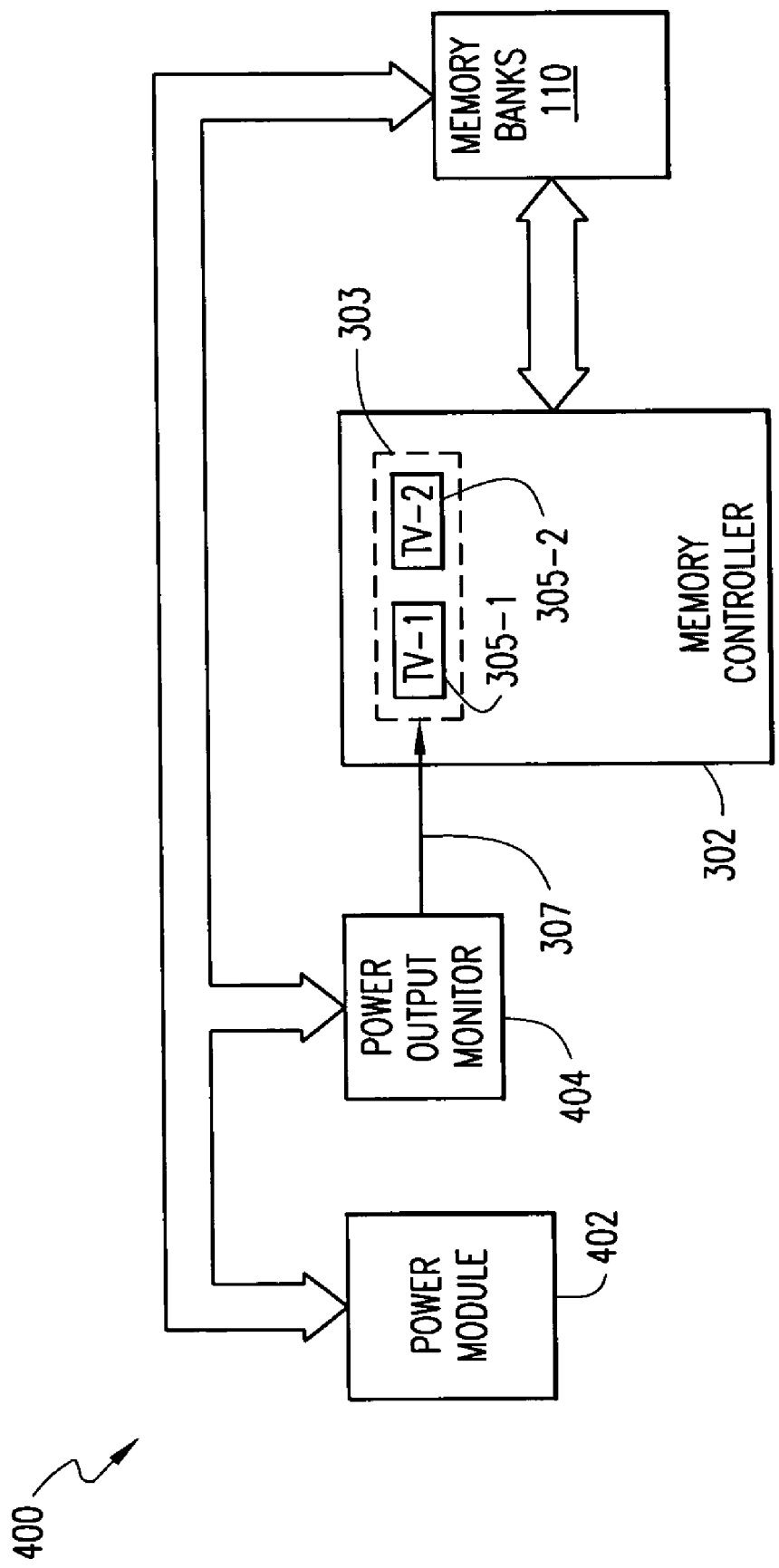
FIG. 4 depicts a block diagram of an exemplary power throttling system according to one embodiment.

FIG. 4 depicts a block diagram of an exemplary power throttling system 400 according to one embodiment which may be implemented in multiprocessor environments (such as, e.g., the computer system 100 shown in FIG. 1) as well as single-processor environments. A power module 402 is operable to supply power to one or more memory banks 110 controlled by the memory controller 302. A power output monitor 404 associated with the power module 402 for monitoring output power is operable to drive the throttle control signal 307 to the memory controller 302.

As described above, if the monitor 404 detects that the capacity of the power module has dropped below the load demand, the throttle control signal 307 is driven to an over-threshold state which, in turn, indicates to the TV selection logic of the memory controller 302 that a lower TV is to be selected, whereby a reduced rate of memory operation cycles are issued to the memory bank 110. Accordingly, the memory bank 110 uses less power when throttled with fewer cycles. When the capacity of the power module has returned to a sufficient level, the power output monitor 404 drives the throttle control signal 307 to its original state, i.e., normal current state, thereby permitting the memory controller 302 to throttle using a higher TV setting which results in issuing cycles more frequently. As a consequence, both power and performance of the memory bank 110 are increased.

It should be appreciated upon reference hereto that although the block diagram of the exemplary power throttling system 400 is shown with discrete blocks, some of the components may be integrated within a single assembly. For instance, the functionality of the power output monitor 404 may be integrated within the power module 402, which in turn may be provided as part of a controller board that includes the memory controller 302. By way of implementation, a differential operational amplifier (op amp) or a resistor-based current sensor can be used for monitoring the output power. Additionally, the TV settings of the memory controller 302 may be provided to be programmable to any desired power level. In one embodiment, the contents of the TV storage elements are operable to be configured by an OS running on the computer system. In another embodiment, the contents of the TV storage elements are operable to be configured by a system management software application. In a still further embodiment, the contents of the TV storage elements are operable to be dynamically configured by a user. If, for example, the total system power is too high over a period of time, the TVs may be set to a constant low value. Upon returning to a more normal power level, the TVs may be set to different values for throttling at variable levels.

Figure 5:
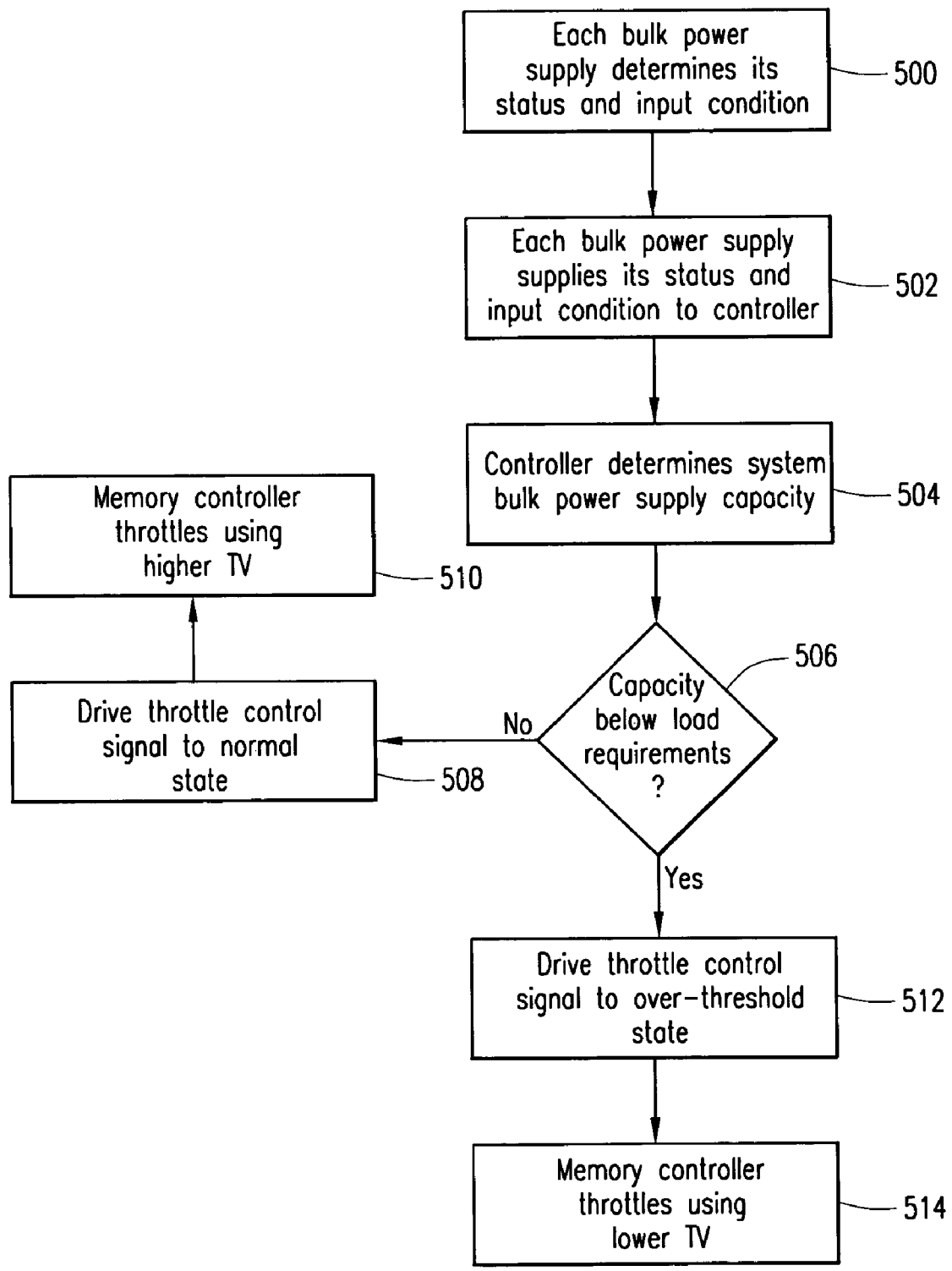
FIG. 5 is a flowchart of an exemplary power throttling method according to one embodiment.

FIG. 5 is a flowchart of an exemplary power throttling method according to one embodiment. At block 502, each of the 2N BPSs determines its status (good or faulted). Each BPS then outputs its status to the power output monitor (block 504). The power output monitor determines if the bulk power supply capacity of the system has dropped below system requirements (block 506). In one embodiment, if less than N+1 of the BPSs are functioning properly, it will be determined that the bulk power supply capacity of the system has dropped below system requirements.

If the bulk power supply capacity has not dropped below system requirements, the power output monitor drives the throttle control signal to a normal state (block 508), in response to which the memory controller 302 throttles memory accesses using a higher TV setting, which results in memory operation cycles being issued to the memory more frequently (block 510). If the bulk power supply capacity of the system has dropped below the demand, the power output monitor drives the throttle control signal to an over-threshold state (block 512). In response, the memory controller throttles memory accesses using a lower TV setting, which results in memory operation cycles being issued to the memory at a reduced rate (block 514). It will be recognized that the process illustrated in FIG. 5 is repeated periodically.

Figure 6:
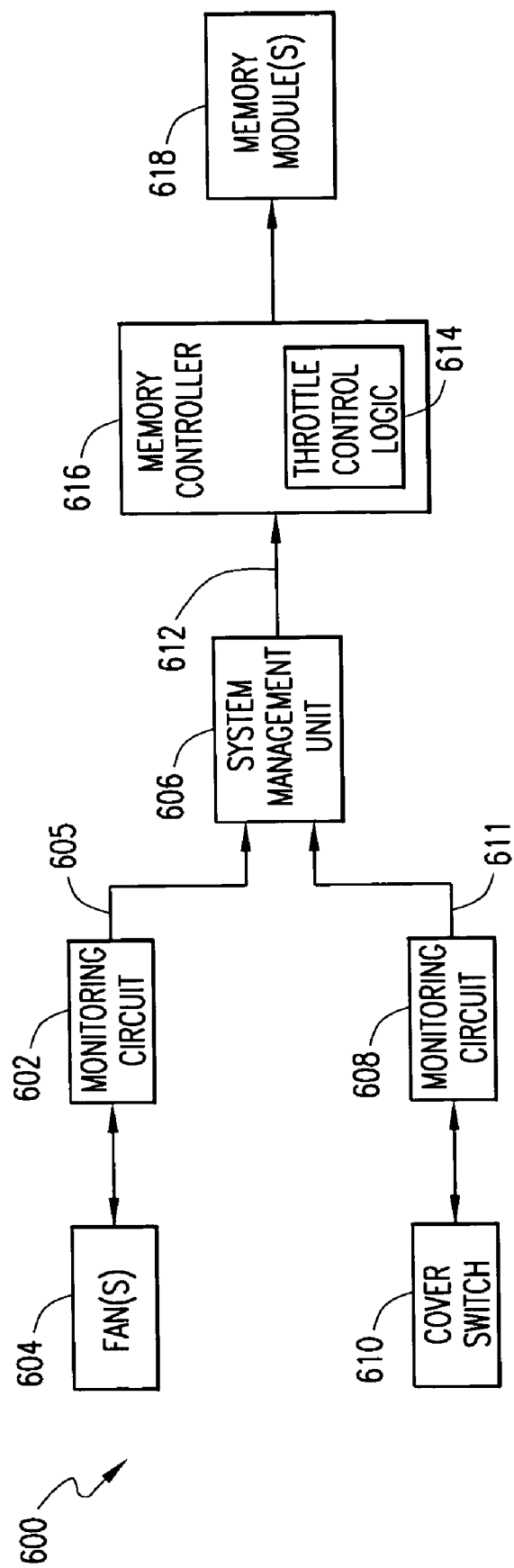
FIG. 6 depicts a block diagram of an alternative embodiment of an exemplary computer system wherein a power throttling scheme may be practiced in accordance with the teachings of the present disclosure.

FIG. 6 depicts a block diagram of an alternative embodiment 600 of an exemplary computer system wherein a power throttling scheme may be practiced in accordance with the teachings of the present disclosure. In particular, the alternative embodiment described below provides for monitoring of environmental conditions of the computer system, such as fan operation and cover switch state, wherein throttling of memory accesses is initiated responsive to a change in the monitored environmental conditions that would cause result in increased memory device operating temperature. In particular, as illustrated in FIG. 6, a first monitoring circuit 602 monitors a state of a first environmental condition, e.g., one or more fans 604, and generates a first control signal 605 to a system management unit ("SMU") 606 comprising, for example a microcontroller, a field programmable gate array ("FPGA"), or a digital signal processor ("DSP"), indicative of the state of the environmental condition (e.g., fan operation). Similarly, a second monitoring circuit 608 monitors a state of a second environmental condition, e.g., a cover switch 610, and generates a second control signal 611 to the SMU 606 indicative of the state of the second environmental condition (e.g., whether the cover is on or off). It will be recognized that, although only two environmental conditions are shown as being monitored, any number and variety of such conditions (for example, temperature) may be monitored and reacted to as described herein. The SMU 606 generates a throttle control signal 612 to throttle control logic 614 of a memory controller 616 for controlling one or more DIMMs 618. As described above, the state of the throttle control signal 612 (i.e., "over-threshold" or "normal") controls whether memory accesses are throttled.

In one embodiment, responsive to a change in either of the monitored environmental conditions that would result in the memory devices operating at a higher temperature, (e.g., failure of one or more of the fans 604 or removal of the cover, as indicated by the state of the cover switch 610), as indicated by either the first control signal 605 from the first monitoring circuit 604 or the second control signal 611 from the second monitoring circuit 608, the SMU 606 drives the throttle control signal 612 to an over-threshold state, resulting in throttling of memory accesses of the DIMMs 618 controlled by the memory controller in a manner similar to that described in detail above in connection with FIGS. 1-5. Similarly, correction of all of the monitored environmental conditions will result in the throttle control signal 612 being returned to a normal state, resulting in the cessation of the throttling of memory accesses.

Based on the foregoing Detailed Description, it should be appreciated that an implementation of the embodiments described herein thus provides a technology-independent power throttling scheme for memory controllers disposed in any known or heretofore unknown computer environments. The embodiments are intended to be flexible enough to respond quickly to a surge in power so that power supply modules do not have to be over-designed. Additionally, the embodiments are sufficiently adaptable in that fairly precise power limits can be selected over a broad range of power supply spectrum. By throttling memory power consumption in real-time, a computer system can be designed to dissipate a significant amount of power in a dynamic manner, so that drastic overprovisioning in terms of power supply, cooling systems, line power design, etc., can be avoided advantageously.

Although the invention has been described with reference to certain exemplary embodiments, it is to be understood that the forms of the invention shown and described are to be treated as illustrative only. Accordingly, various changes, substitutions and modifications can be realized without departing from the scope of the present invention as set forth in the following claims.

What is claimed is:

1. A power throttling method for a memory controller for controlling access to at least one memory device in a computer system, the method comprising:

monitoring a state associated with a cover switch of the computer system;

responsive to the monitoring, determining whether a change in the state of the cover switch has occurred that will result in an increase in an operating temperature of the at least one memory device during normal operation; and responsive to a positive determination, driving a throttle control signal to the memory controller to a level indicative of an overthreshold state.

2. The power throttling method for a memory controller as recited in claim 1 further comprising:

providing at least a first and second throttle value in the memory controller, the at least first and second throttle values for controlling memory operation cycles issued by the memory controller to at least one memory device; and responsive to the throttle control signal being driven to a level indicative of an over-threshold state, selecting by the memory controller a lower value of the at least first and second throttle values, whereby the memory operation cycles are issued to the one or more memory devices at a reduced rate.

3. The power throttling method for a memory controller as recited in claim 2, further comprising:

responsive to a negative determination, driving the throttle control signal to a level indicative of a normal current state; and responsive to the throttle control signal being driven to a level indicative of a normal current state, selecting by the memory controller a higher value of the at least first and second throttle values whereby the memory operation cycles are issued to the at least one memory device at an increased rate.

4. The power throttling method for a memory controller as recited in claim 1, wherein the change in the state of the cover switch that will result in an increase in an operating temperature of the at least one memory device during normal operation comprises the cover switch indicating removal of a cover of. the computer system.

5. A power throttling system for a memory controller for controlling access to at least one memory device in a computer, the system comprising:

means for monitoring a state associated with a cover switch of the computer;

means, responsive to the monitoring, for determining whether a change in the state of the cover switch has occurred that will result in an increase in an operating temperature of the at least one memory device during normal operation; and means, responsive to a positive determination, for driving a throttle control signal to the memory controller to a level indicative of an overthreshold state.

6. The power throttling system for a memory controller as recited in claim 5 further comprising:

at least a first and a second throttle value in provided the memory controller, the at least first and second throttle values for controlling memory operation cycles issued by the memory controller to at least one memory device; and means, responsive to the throttle control signal being driven to a level indicative of an over-threshold state, for selecting by the memory controller a lower value of the at least first and second throttle values, whereby the memory operation cycles are issued to the one or more memory devices at a reduced rate.

7. The power throttling system for a memory controller as recited in claim 6, further comprising:

means, responsive to a negative determination, for driving the throttle control signal to a level indicative of a normal current state; and means, responsive to the throttle control signal being driven to a level indicative of a normal current state, for selecting by the memory controller a higher value of the at least first and second throttle values, whereby the memory operation cycles are issued to the at least one memory device at an increased rate.

8. The power throttling system for a memory controller as recited in claim 5, wherein the change in the state of the cover switch that will result in an increase in an operating temperature of the at least one memory device during normal operation comprises the cover switch indicating removal of a cover of the computer system.

9. A power throttling system for a memory controller for controlling access to at least one memory device in a computer, the system comprising:

circuitry for monitoring a state associated with cover switch of the computer; and a system management unit ("SMU") connected between the monitoring circuitry and the memory controller for:

responsive to the monitoring, determining whether a change in state of the cover switch has occurred that will result in an increase in an operating temperature of the at least one memory device during normal operation; and responsive to a positive determination, driving a throttle control signal to the memory controller to a level indicative of an over-threshold state.

10. The power throttling system for a memory controller as recited in claim 9 further comprising:

throttle control logic disposed in the memory controller, the throttle control logic including at least a first and a second throttle value in provided the memory controller, the at least first and second throttle values for controlling memory operation cycles issued by the memory controller to at least one memory device; and wherein, responsive to the throttle control signal being driven to a level indicative of an overthreshold state, the throttle control logic selects a lower value of the at least first and second throttle values, whereby the memory operation cycles are issued to the one or more memory devices at a reduced rate.

11. The power throttling system for a memory controller as recited in claim 10:

wherein, responsive to a negative determination, the SMU drives the throttle control signal to a level indicative of a normal current state; and wherein, responsive to the throttle control signal being driven to a level indicative of a normal current state, the throttle control logic selects a higher value of the at least first and second throttle values, whereby the memory operation cycles are issued to the at least one memory device at an increased rate.

12. The power throttling system for a memory controller as recited in claim 9, wherein the change in the state of a cover switch that will result in an increase in an operating temperature of the at least one memory device during normal operation comprises the cover switch indicating removal of a cover of the computer system.

* * * * *

UNITED STATES PATENT AND TRADEMARK OFFICE
CERTIFICATE OF CORRECTION

PATENT NO. : 7,472,292 B2
APPLICATION NO. : 11/242686
DATED : December 30, 2008
INVENTOR(S) : Bradley Dean Winick et al.

It is certified that error appears in the above-identified patent and that said Letters Patent is hereby corrected as shown below:

In column 2, line 56, delete "BFSs" and insert -- BPSs --, therefor.

In column 2, line 59, delete "ACO" and insert -- AC0 --, therefor.

In column 2, line 60, delete "1201" and insert -- 120-1 --, therefor.

In column 6, line 63, in Claim 1, delete "overthreshold" and insert -- over-threshold --, therefor.

In column 7, line 18, in Claim 3, after "values" insert -- , --.

In column 7, line 26, in Claim 4, delete "of." and insert -- of --, therefor.

In column 7, line 39, in Claim 5, delete "overthreshold" and insert -- over-threshold --, therefor.

In column 8, line 36, in Claim 10, delete "overthreshold" and insert -- over-threshold --, therefor.

Signed and Sealed this

Fourteenth Day of April, 2009

JOHN DOLL
*Acting Director of the United States Patent and Trademark Office*